(12) United States Patent
Matsuda et al.

(10) Patent No.: US 10,777,725 B2
(45) Date of Patent: Sep. 15, 2020

(54) THERMOELECTRIC GENERATOR

(71) Applicant: DENSO CORPORATION, Kariya, Aichi-pref. (JP)

(72) Inventors: Takuya Matsuda, Kariya (JP); Shinya Kitagawa, Kariya (JP); Yoshiyuki Okamoto, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 62 days.

(21) Appl. No.: 16/091,125

(22) PCT Filed: Mar. 24, 2017

(86) PCT No.: PCT/JP2017/011947
§ 371 (c)(1),
(2) Date: Oct. 4, 2018

(87) PCT Pub. No.: WO2017/175601
PCT Pub. Date: Oct. 12, 2017

(65) Prior Publication Data
US 2019/0115519 A1 Apr. 18, 2019

(30) Foreign Application Priority Data

Apr. 6, 2016 (JP) .................................. 2016-076846

(51) Int. Cl.
*H01L 35/30* (2006.01)
*H02N 11/00* (2006.01)
(Continued)

(52) U.S. Cl.
CPC .............. *H01L 35/30* (2013.01); *F28F 3/025* (2013.01); *F28F 3/027* (2013.01); *H01L 23/10* (2013.01);
(Continued)

(58) Field of Classification Search
CPC ......... H01L 35/30; H01L 35/32; H01L 23/10; H01L 23/467; H01L 23/473; H01L 25/10; F28F 3/025; F28F 3/027
See application file for complete search history.

(56) References Cited

U.S. PATENT DOCUMENTS

2013/0014796 A1\* 1/2013 Tajima .................... H01L 35/08
136/203
2013/0186448 A1\* 7/2013 Ranalli .................... F01N 5/025
136/204
(Continued)

FOREIGN PATENT DOCUMENTS

| JP | H10234194 A | 9/1998 |
|----|-------------|--------|
| JP | 2000172347 A | 6/2000 |

(Continued)

*Primary Examiner* — Jayne L Mershon
(74) *Attorney, Agent, or Firm* — Harness, Dickey & Pierce, P.L.C.

(57) ABSTRACT

A thermoelectric generator includes a tube in which a first fluid flows, a power generation module, a holding member, and a heat exchanging fin. The power generation module includes a thermoelectric conversion element. The holding member holds a stacked body in which the power generation module and the tube are stacked with each other such that heat can be transferred between the power generation module and the tube. Both end portions of the holding member are located and fixed outside both ends of the stacked body. The heat exchanging fin includes a pair of end fin portions provided on the reverse surface of the holding member at portions corresponding to the both ends of the stacked body, and an intermediate fin located between the pair of end fin portions and higher in stiffness than the pair of end fin portions.

7 Claims, 5 Drawing Sheets

(51) Int. Cl.
*F28F 3/02* (2006.01)
*H01L 23/10* (2006.01)
*H01L 23/467* (2006.01)
*H01L 23/473* (2006.01)
*H01L 25/10* (2006.01)
*H01L 35/32* (2006.01)

(52) U.S. Cl.
CPC .......... *H01L 23/467* (2013.01); *H01L 23/473* (2013.01); *H01L 25/10* (2013.01); *H01L 35/32* (2013.01); *H02N 11/00* (2013.01); *F28F 2215/04* (2013.01); *F28F 2215/08* (2013.01)

(56) References Cited

U.S. PATENT DOCUMENTS

| 2015/0013739 | A1  | 1/2015 | Kanie et al. |
| 2016/0035957 | A1* | 2/2016 | Casey ................ H01L 35/32 |
| | | | 136/230 |

FOREIGN PATENT DOCUMENTS

| JP | 2006303037 A | 11/2006 |
| JP | 2013140883 A | 7/2013 |
| JP | 2014127617 A | 7/2014 |
| JP | 2015032657 A | 2/2015 |

* cited by examiner

THERMOELECTRIC GENERATOR

CROSS REFERENCE TO RELATED APPLICATIONS

This application is a U.S. National Phase Application under 35 U.S.C. 371 of International Application No. PCT/JP2017/011947 filed on Mar. 24, 2017. This application is based on and claims the benefit of priority from Japanese Patent Application No. 2016-076846 filed on Apr. 6, 2016. The entire disclosures of all of the above applications are incorporated herein by reference.

TECHNICAL FIELD

The disclosure in this specification relates to a thermoelectric generator that converts thermal energy into electric energy by Seebeck effect.

BACKGROUND ART

The thermoelectric generator of Patent Document 1 has a casing for accommodating a thermoelectric conversion element. This casing is constituted of an upper case and a lower case. Flanges formed at outer edge portions of the upper case and the lower case are welded to each other in a state where the thermoelectric conversion element is sandwiched, and thus the casing is formed. The lower case includes a flat contact surface contacting the thermoelectric conversion element via a high temperature side insulating member, and a rib protruding so as to surround the contact surface. The upper case includes a flat contact surface contacting the thermoelectric conversion element via a low temperature side insulating member, and a rib protruding so as to surround the contact surface.

PRIOR ART DOCUMENT

Patent Document

Patent Document 1: JP2013-140883A

SUMMARY OF THE INVENTION

In the device of Patent Document 1, a rib is provided in each of the upper case and the lower case so as to surround the contact surface of the upper case or the lower case contacting the thermoelectric conversion element, and accordingly the rib increases stiffness. It is intended to secure a flat surface of the heat exchanging portion and to improve adhesiveness between the cases and the thermoelectric conversion element. However, when the external force does not act on the entire case but directly acts so that the part constituting the contact surface bends, the part may be easily bent because the strength of the part itself is not enough. If an external force which is difficult to receive the effect of improving stiffness is exerted, the surface contact pressure between the case and the thermoelectric conversion element may be unevenly distributed, and accordingly the adhesiveness between the case and the thermoelectric conversion element may be deteriorated.

In consideration of the above-described points, it is an objective of the present disclosure to provide a thermoelectric generator uniforming a surface contact pressure between a thermoelectric conversion element and a holding member holding the thermoelectric conversion element.

A thermoelectric generator according to a first aspect includes a tube in which a first fluid flows, a power generation module, a holding member, and a heat exchanging fin. The power generation module includes a thermoelectric conversion element and is stacked with the tube. The holding member provides a holding force to hold a stacked body in which the power generation module and the tube are stacked with each other such that heat can be transferred between the power generation module and the tube. Both end portions of the holding member are located and fixed outside both ends of the stacked body. The heat exchanging fin is provided on a reverse surface of the holding member behind which a surface of the holding member contacts with a second fluid higher in temperature than the first fluid. The heat exchanging fin includes a pair of end fin portions provided on the reverse surface of the holding member at portions corresponding to the both ends of the stacked body, and an intermediate fin located between the pair of end fin portions and higher in stiffness than the pair of end fin portions. According to the thermoelectric generator, the both end portions of the holding members which are located outside the both ends of the stacked body constituted by the power generation module and the tube are fixed such that the holding members hold the stacked body so as to transfer heat. In a device providing such holding force, the surface contact pressure between the holding member and the power generation module is higher at the both ends of the stacked body than at the center portion. Then, the surface contact pressure between the holding member and the power generation module becomes nonuniform as a whole, causing the holding member to rise up, and adversely affecting the heat transferability between the holding member and the power generation module.

According to the thermoelectric generator of the present disclosure, the heat exchanging fin is configured to have a higher stiffness at the end fin portions than at the intermediate fin portion. Therefore, the deformation of the holding portion at a portion corresponding to the intermediate fin portion can be suppressed. According to this, it is possible to secure the heat exchange performance by the heat exchanging fin, and it is possible to reduce the difference between the surface contact pressure between the center portion and the power generation module and the surface contact pressure between the both end portions and the power generation module using the heat exchange fin. Therefore, it is possible to provide a thermoelectric generator capable of uniforming the surface contact pressure between the thermoelectric conversion element and the holding member holding the thermoelectric conversion element, and suppressing rising up of the holding member.

EMBODIMENTS FOR EXPLOITATION OF THE INVENTION

Figure 1:
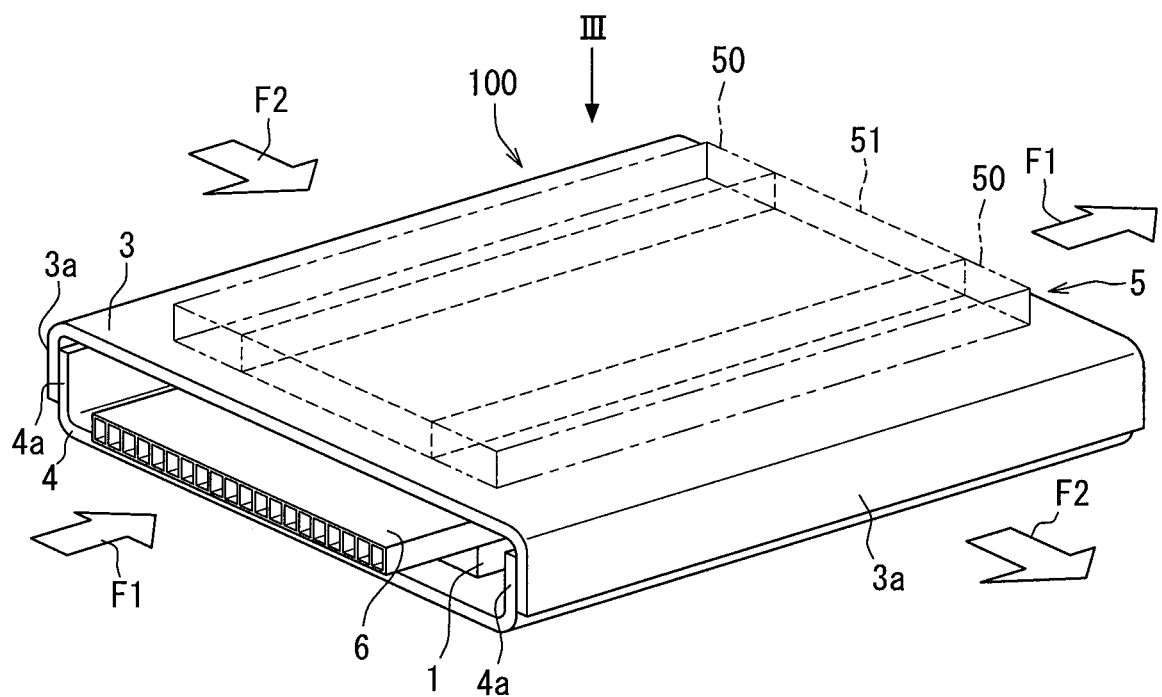
FIG. 1 is a perspective view illustrating a schematic configuration of a thermoelectric generator according to a first embodiment of the present disclosure.

Hereinafter, embodiments for implementing the present disclosure will be described referring to drawings. In each embodiment, portions corresponding to the elements described in the preceding embodiments are denoted by the same reference numerals, and redundant explanation may be omitted. In each of the embodiments, when only a part of the configuration is described, the other parts of the configuration can be applied to the other embodiments described above. The parts may be combined even if it is not explicitly described that the parts can be combined. The embodiments may be partially combined even if it is not explicitly described that the embodiments can be combined, provided there is no harm in the combination.

First Embodiment

A thermoelectric generator 100 as an example is disclosed in a first embodiment. The first embodiment will be described with reference to FIGS. 1 to 6. The thermoelectric generator 100 is configured to generate electricity by converting thermal energy into electric energy by the Seebeck effect. When a temperature difference is given between one side and the other side of a power generation module having a thermoelectric conversion element, the thermoelectric generator 100 generates electricity utilizing a phenomenon that a potential difference occurs and electrons flow. In the thermoelectric generator 100, a temperature difference is given between both sides of the power generation module using a low temperature first fluid and a second fluid whose temperature is higher than the first fluid. Any fluid capable of giving a temperature difference can be adopted for the first fluid and the second fluid. In this embodiment, a case where cooling water of an automotive engine is used as the first fluid and an exhaust gas discharged from the automobile engine is used as the second fluid is explained, as an example of the first fluid and the second fluid. Hereinafter, the first fluid may be referred to as a low-temperature fluid and the second fluid may be referred to as a high-temperature fluid having a higher temperature than the low temperature fluid.

The thermoelectric generator 100 includes a first passage through which the high-temperature fluid flows, a second passage through which the low-temperature fluid flows, and a power generation module 1 that is provided so as to be able to exchange heat with the high-temperature fluid on one side and with the low-temperature fluid on the other side. The thermoelectric generator 100 further includes a first holding member 3 and a second holding member 4 for enhancing adhesion between the members so as to ensure heat transfer between the low temperature fluid and the high temperature fluid and the power generation module 1. The first holding member 3 and the second holding member 4 are hereinafter also referred to as holding members 3, 4.

Each power generation module 1 has a thermoelectric conversion element. Multiple thermoelectric conversion elements are accommodated in a casing that is a box member having a flat shape. Multiple thermoelectric conversion elements are aligned in a flow direction F2 of the high-temperature fluid in the power generation module 1. An inside of the casing is in a vacuum state or filled with an inert gas in order to prevent oxidation of the thermoelectric conversion elements, for example. This casing is also an airtight casing that seals its internal space. The casing is made of a stainless steel material, for example.

The thermoelectric conversion element is configured by connecting P-type semiconductor elements and N-type semiconductor elements alternately arranged in a net shape. One side of the power generation module 1 is in contact with the high-temperature fluid or a high-temperature portion configured to transfer heat of the high-temperature fluid, and the other side of the power generation module 1 is in contact with the low-temperature fluid or a low-temperature portion configured to transfer heat of the low-temperature fluid. Accordingly, a temperature difference occurs between one side and the other side of the thermoelectric conversion element, and electricity is generated by movement of electrons due to a potential difference.

One side of the power generation module 1 located on one side of the thermoelectric generator 100 is in contact with the first holding member 3 constituting the high-temperature portion, and the other side is in contact with a tube 6 constituting the low-temperature portion. One side of the power generation module located on the other side of the thermoelectric generator 100 is in contact with the tube 6 constituting the low-temperature portion, and the other side is in contact with the second holding member 4 constituting the high-temperature portion. Each of the holding members 3,4 can be formed, for example, by processing a plate-shaped member.

Both ends of the first holding member 3 and the second holding member 4 are formed so as to be weldable to each other. This shape can be formed by casting or folding. As this shape, the first holding member 3 has a joining portion 3a positioned on a distal end side with respect to a right-angled curved portion on each of both end sides, and the second holding member 4 has a joining portion 4a positioned on a distal end side with respect to a right-angled curved portion on each of both end sides.

The joining portion 3a and the joining portion 4a form an overlapping portion extending in a direction parallel to the flow direction F1 of the low-temperature fluid flowing inside the tube 6. The overlapping portion is welded to each other by, for example, seam welding or laser welding. The joining portion 3a and the joining portion 4a correspond to both end portions located on the outer side of the holding members 3, 4 than the both end portions of the stacked body in which the power generation module 1 and the tube 6 are stacked integrally. The first holding member 3 and the second holding member 4 provide a holding force for holding the stacked body in a state where both end portions are fixed. In this way, the tube 6 is sandwiched and held between two power generation modules 1 by the compression force given by the first holding member 3 and the second holding member 4. The compression force is a force exerted in the direction indicated by outlined arrows in FIG. 2. The joining portion 3a and the joining portion 4a may be located outside the stacked body in the cross-sectional longitudinal direction of the tube 6. The cross-sectional longitudinal direction of the tube 6 may be the width direction of the tube 6.

The tube 6 and the power generation module 1 are held by the aforementioned compression force and are not individually fixed to the first holding member 3 or the second holding member 4. That is, the tube 6 and the power generation module 1 can be displaced in the flow direction F2 of the high-temperature fluid with respect to the first holding member 3 and the second holding member 4 according to the expansion and contraction of each member. Therefore, since the tube 6 and the power generation module 1 can be displaced even if each member expands or contracts due to the temperature difference between the high-temperature fluid and the low-temperature fluid, it is possible to reduce the stress due to the distortion of each member or absorb thermal expansion difference.

By the joining of the first holding member 3 and the second holding member 4 by welding, an internal space that is a space defined by the first holding member 3 and the second holding member 4 is formed. Two power generation modules 1 and tube 6 are accommodated in the internal space. The tube 6 is made of, for example, stainless steel or aluminum, and has a second passage partitioned into multiple internal passages in which the low temperature fluid flows. The tube 6 has the same length as the power generation module 1 in the flow direction F2 and has a length equal to or greater than that of the power generation module 1 in the flow direction F1.

A heat exchanging fin 5 is provided on a reverse surface of the first holding member 3 behind which the surface of the first holding member 3 contacts the power generation module 1. The heat exchanging fin 5 is provided on a reverse surface of the second holding member 4 behind which the surface of the second holding member 4 contacts the power generation module 1. The heat exchanging fin 5 is provided in the first passage through which the high-temperature fluid contacting the heat exchanging fin 5 flows.

The thermoelectric generator 100 includes the tube 6 having flat outer surfaces between which the low-temperature fluid flows, and two power generation modules 1 sandwich and are in contact with the outer surfaces of the tube 6. The power generation modules 1 include the thermoelectric conversion element therein. The first holding member 3 is made from an iron plate or a stainless steel plate, and is contact with a surface of one of the power generation modules opposite from the tube 6. The second holding member 4 is made from an iron plate or a stainless steel plate, and is contact with a surface of the other one of the power generation modules opposite from the tube 6. The heat exchanging fin 5 made of stainless steel or aluminum is joined to the surface of the first holding member 3 on the side opposite to the power generation module 1 by brazing or the like. The heat exchanging fin 5 made of stainless steel or aluminum is joined to the surface of the second holding member 4 on the side opposite to the power generation module 1 by brazing or the like.

Figure 2:
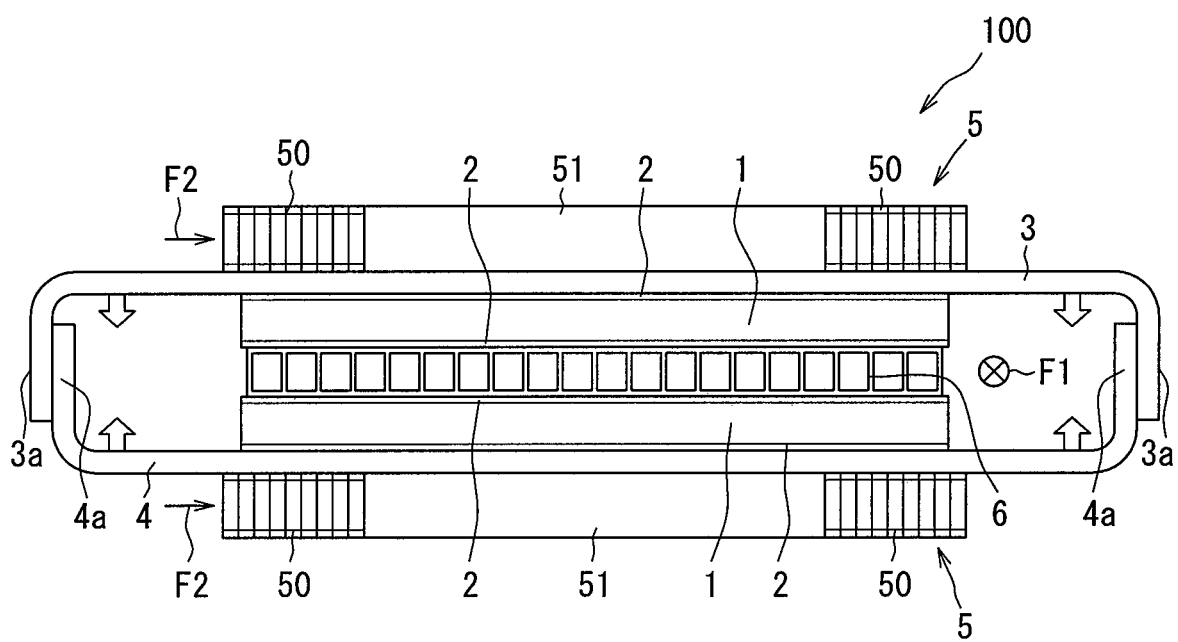
FIG. 2 is a front view illustrating the thermoelectric generator according to the present disclosure.
Figure 3:
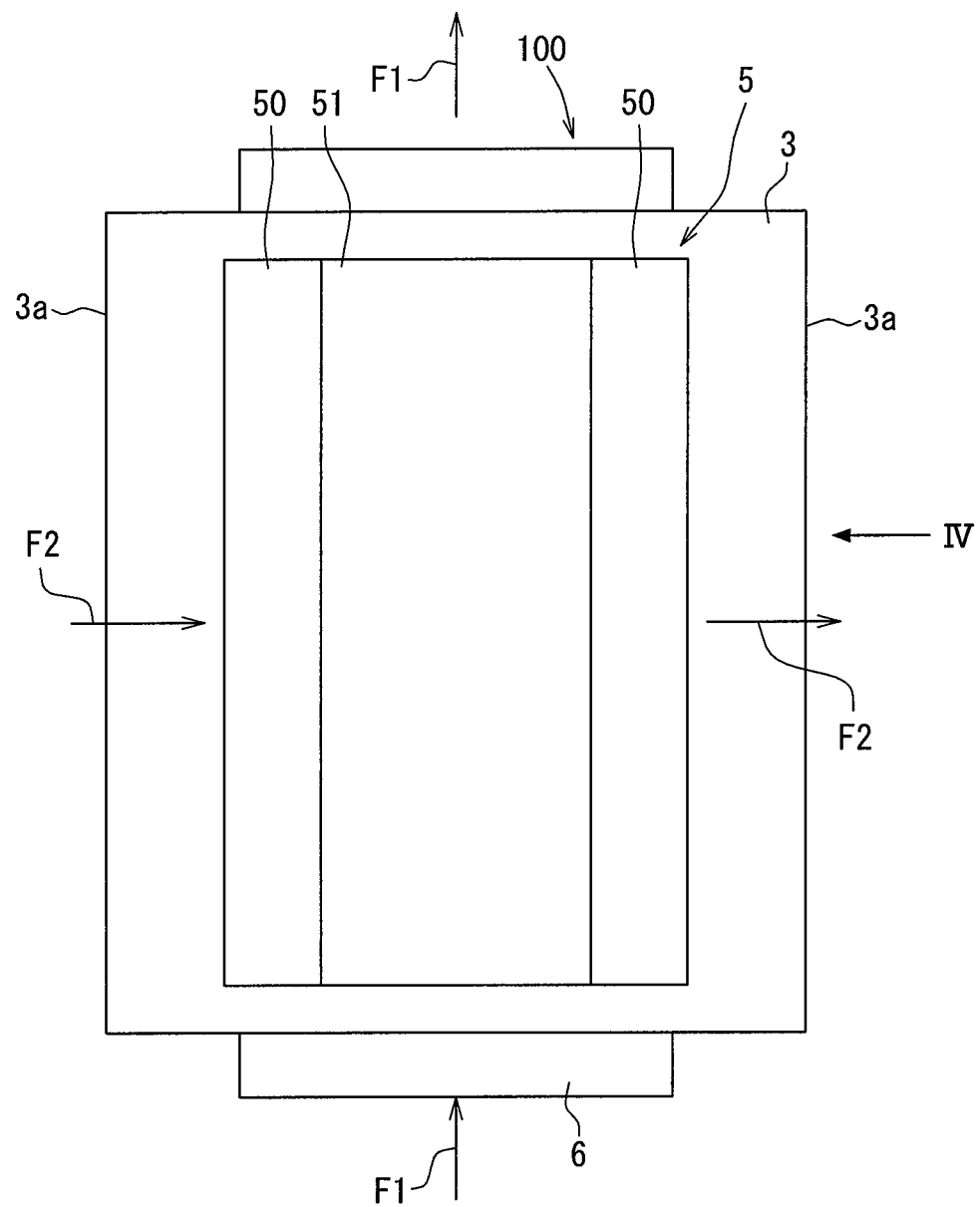
FIG. 3 is a plan view illustrating the thermoelectric generator viewed in a direction of an arrow III in FIG. 1.
Figure 4:
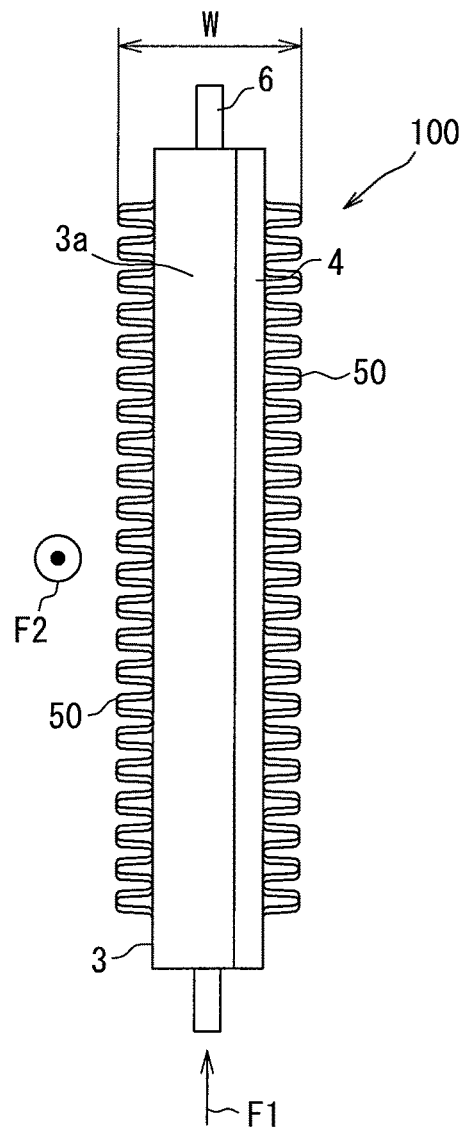
FIG. 4 is a side view illustrating the thermoelectric generator viewed in a direction of an arrow IV in FIG. 3.

As shown in FIGS. 1 to 3, the heat exchanging fin 5 includes an end fin portion 50 and an intermediate fin portion 51. Both the end fin portion 50 and the intermediate fin portion 51 have the effect of promoting the heat conduction to enhance the heat exchange between the heat transferred to the first holding member 3 and the second holding member 4 and the high-temperature fluid flowing in the surroundings. The intermediate fin portion 51 has a shape or is made of a material having a higher stiffness than that of the end fin portion 50. When the intermediate fin portion 51 has the same shape as the end fin portion 50, the intermediate fin portion 51 may have a thickness providing a higher stiffness than that of the end fin portion 50. The end fin portion 50 is a part of the heat exchanging fin 5 shown by a two-dot chain line in FIG. 1. The intermediate fin portion 51 is a part of the heat exchanging fin 5 shown by a dashed line in FIG. 1. In FIGS. 2 and 3, the specific shape of the intermediate fin portion 51 is omitted.

The end fin portion 50 is positioned on a part of the surface of the holding portions 3, 4 that is a reverse side on which the both end portions of the stacked body sandwiched by the first holding member 3 and the second holding member 4. That is, a pair of the end fin portions 50 is provided so as to occupy a predetermined range on both end portions of the width of the heat exchanging fin 5 along the direction F2. A length of the end fin portion 50 in the flow direction F1 is the same as that of the power generation module 1. The intermediate fin portion 51 is between a pair of the end fin portion 50 provided on the both ends of the heat exchanging fin 5.

As described above, the first holding member 3 and the second holding member 4 are fixed in a state where a force is applied in the direction indicated by the outlined arrows. Accordingly, a bending stress exerted on the first holding member 3 causes a deformation such that the central portion is convex upward with respect to the joining portion 3a side. Similarly, a bending stress exerted on the second holding member 4 causes a deformation such that the central portion is convex downward with respect to the joining portion 4a side. According to studies of the inventors, a surface contact pressure between the power generation module 1 and the holding member is large on the both side portion compared to the center portion. Accordingly, the surface contact pressure is unevenly distributed, and the heat transferability between the holding member that is the high-temperature portion and the thermoelectric conversion element may be impaired.

In the thermoelectric generator 100, the stiffness of the intermediate fin portion 51 of the heat exchanging fin 5 is higher than the end fin portion 50 provided on both sides. Accordingly, the center portion of the holding members 3, 4 is strong against bending stress. Accordingly, the degree of deformation in which the center portion is convex toward the joining portion is reduced, and the situation can be avoided, in which the surface contact pressure between the power generation module 1 and the center portion of the holding portions 3, 4 is significantly smaller than the surface contact pressure between the power generation module 1 and the both side portions.

Figure 5:
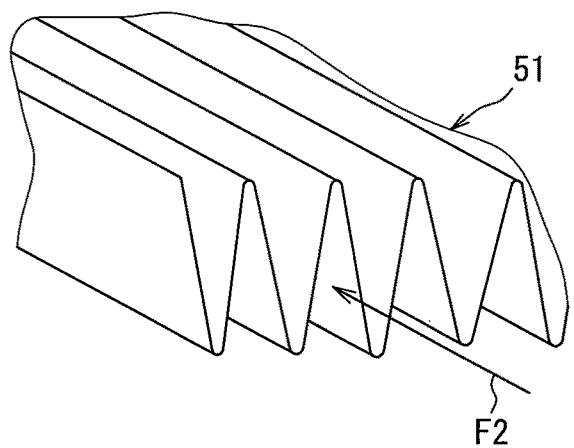
FIG. 5 is a diagram illustrating an intermediate fin portion of a heat exchanging fin according to the first embodiment.

For example, as shown in FIG. 5, the intermediate fin portion 51 is constituted by a straight fin having a corrugated shape in a cross-section perpendicular to the direction F2 and continuously extending in the direction F2. The plate portions of the intermediate fin portion 51 are aligned in a direction perpendicular to the direction F2 and continuously extend throughout the width of the intermediate fin portion 51 in the direction F2. The straight fin has a fin shape in which peak portions and valley portions continuously extend in the direction F2 similarly to the plate portions. The straight fin is formed by bending a flat plate having a predetermined length in the direction F2 required for the intermediate fin portion 51 into a zigzag shape to have a predetermined length in the direction perpendicular to the direction F2. The straight fins formed in this way are joined to predetermined positions of the first holding member 3 and the second holding member 4 respectively, and exert the above-described function as the intermediate fin portion 51.

The intermediate fin portion 51 has a property in which the stiffness in a wave length direction is low and the stiffness in the direction, in which the plate portion extends, is high. Since the intermediate fin portion 51 is brazed to the holding member 3, 4, the stiffness of the holding member can be improved. Accordingly, a decrease in the surface contact pressure and a gap are unlikely to occur between the center portions of the first holding member 3 and the power generation module 1 and between the second holding member 4 and the power generation module 1.

Figure 6:
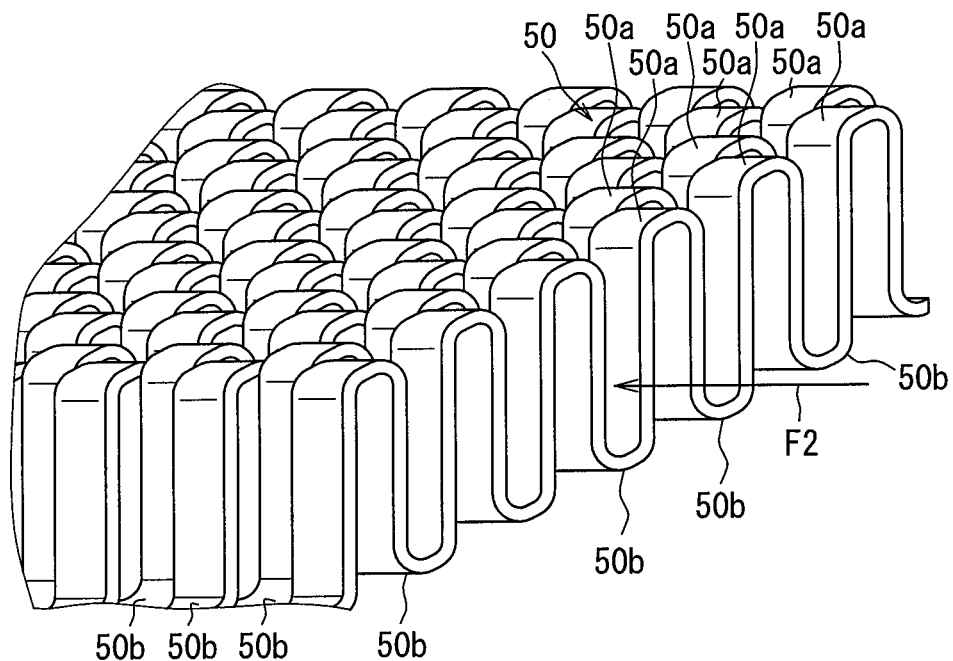
FIG. 6 is a diagram illustrating an end fin portion of the heat exchanging fin according to the first embodiment.

The end fin portion 50 is constituted of, for example, an offset fin. As shown in FIG. 6, in the offset fin, wave fins adjacent to each other in a first direction are offset from each other in a direction perpendicular to the first direction. Further, in the offset fin, wave fins adjacent to each other in the first direction are positioned in a zigzag manner in the first direction. In this embodiment, as an example, a configuration in which the first direction is the direction F2 of high temperature fluid flow will be described. Therefore, the first direction may be a direction intersecting the direction F2. Further, the first direction is preferably a direction (a direction F2 in the drawing) in which a line segment connecting the joining portions at both ends of each of the holding members 3, 4 extends.

As described above, the end fin portion 50 has multiple corrugated-shaped portions alternately having peak portions 50a and valley portions 50b along a direction perpendicular to the first direction. The end fin portion 50 constitutes an offset fin in which adjacent peak portions 50a and adjacent valley portions 50b are offset from each other along a direction perpendicular to the first direction.

The offset fin can be manufactured by placing a plate material made of aluminum, an aluminum alloy, or the like into a forming apparatus, performing slit processing, and performing press forming processing. The offset fin has a shape in which the rising edges of the bent portions adjacent in the airflow direction is offset from each other by a predetermined interval in a direction perpendicular to the airflow direction. For example, as shown in FIG. 6, the rising edges of the bent portions adjacent in the airflow direction is offset from each other by a half width thereof in the direction perpendicular to the airflow direction. Accordingly, since the offset fin includes fins discontinuous in the airflow direction, generation of turbulent flow is enhanced, and accordingly the heat transfer between the fins and the high-temperature fluid can be improved.

The end fin portion 50 has a characteristic that the stiffness is low in the direction in which the adjacent peak portions 50a and the valley portions 50b arranged in an offset arrangement relationship are aligned, i.e. the first direction, compared to the intermediate fin portion 51. This is because the peak portions 50a and the valley portions 50b arranged along the first direction are offset from each other by half width thereof, and accordingly the end fin portion 50 has a discontinuous shape instead of entirely continuous in the first direction such as the intermediate fin portion 51. Since such end fin portion 50 is brazed to the first holding member 3, a part of each of the holding members 3, 4 integrated with the end fin portion 50 has a lower stiffness compared to a part integrated with the intermediate fin portion 51. As a result, since the part integrated with the end fin portion 50 is likely to be bent, the part integrated with the intermediate fin portion 51 is unlikely to be bent, and accordingly a decrease in the surface contact pressure can be suppressed. Therefore, it is possible to make the surface contact pressure as a whole uniform.

Further, a graphite sheet may be interposed between the first holding member 3 and the power generation module 1. A graphite sheet may be interposed between the second holding member 4 and the power generation module 1. A graphite sheet may be interposed between the tube 6 and the power generation module 1. By providing a graphite sheet on the contact part where a gap may be formed, a level difference and unevenness which may cause a gap in the contact portion can be absorbed, and accordingly the thermal conductivity can be secured.

The graphite sheet has a significantly high thermal conductivity. For example, it is preferable to adopt a graphite sheet having a thermal conductivity twice or more higher than that of copper or aluminum. The graphite sheet is a thin, flexible sheet and is easy to deform and process. A graphite sheet can be produced by thermally decomposing a polymer film to graphitize it. Further, it is preferable that the graphite sheet has a structure close to a single crystal having a high orientation property.

The first holding member 3 and the second holding member 4 in a joined state are set to have a length of about 130 mm in the flow direction F2, for example. The heat exchanging fin 5 and the tube 6 sandwiched and held between the first holding member 3 and the second holding member 4 are set to have a length of about 85 mm in the flow direction F2, for example. The tube 6 has a length of about 160 mm in the flow direction F1, for example. A length W of the thermoelectric generator 100 in a stacking direction shown in FIG. 4, i.e. a length between the ends of the heat exchanging fins 5, is about 35 mm.

At the time of assembly, the first holding member 3 and the second holding member 4 are pressurized in the direction indicated by the outlined arrows in FIG. 2 so as to increase a portion where the joining portion 3a and the joining portion 4a overlap with each other. In this pressurized state, the joining portion 3a and the joining portion 4a are welded together by seam welding or laser welding.

Thereby, the first holding member 3 and the second holding member 4 are formed into a product in which the stress sandwiching the power generation module 1 is applied. Furthermore, the power generation module 1 is in close contact with both the first holding member 3, the second holding member 4 and the tube 6. This applied pressure is exerted between the tube 6 and the power generation module 1, between the power generation module 1 and the first holding member 3, and between the power generation module 1 and the second holding member 4, and thereby the contact portions between these members are provided.

Welding of the joining portion 3a and the joining portion 4a is performed by seam welding or laser welding so that a welded portion extending in a direction, in which the low-temperature fluid flows, is formed. According to this, it is possible to firmly weld the joining portion 3a and the joining portion 4a. Further, the welded portion may be formed on the tip end face of the joining portion 3a.

The first holding member 3 and the second holding member 4 are joined with each other in a state where the first holding member 3 and the second holding member 4 are bent on outside of the both ends of the power generation module 1 and elastically deformed. Accordingly, the reaction force of the first holding member 3 and the second holding member 4 elastically deformed secures the adhesion between the power generation module 1, the first holding member 3, the second holding member 4 and the tube 6 while the end portion of the power generation module 1 keeps touching the holding members.

Next, the effects provided by the thermoelectric generator 100 of the first embodiment will be described. The thermoelectric generator 100 includes: the tube 6 through which the low-temperature fluid flows; the power generation module 1 having the thermoelectric conversion element and stacked with the tube 6; the first holding member 3 and the second holding member 4; and the heat exchanging fin 5 in contact with the high-temperature fluid. Both end portions of the first holding member 3 and the second holding member 4 which are located outside the both ends of the stacked body constituted by the power generation module 1 and the tube 6 are fixed such that the first holding member 3 and the second holding member 4 hold the power generation module 1 and the tube 6 so as to transfer heat therebetween. The heat exchanging fin 5 includes: a pair of the end fin portions 50 located on a reverse surface behind which the both ends of the stacked body is provided; and the intermediate fin portion 51 located between the end fin portions 50 and having a higher stiffness than the end fin portion 50.

According to the thermoelectric generator 100, the both end portions of the holding members 3, 4 which are located outside the both ends of the stacked body constituted by the power generation module 1 and the tube 6 are fixed such that the holding members 3, 4 hold the stacked body so as to transfer heat. In a device providing such holding force, the surface contact pressure between the holding member and the power generation module is large at the both ends of the stacked body compared to the center portion, and the surface contact pressure between the holding member and the power generation module may be nonuniform as a whole. Accordingly, the thermal conductivity between the holding member and the power generation module may be deteriorated.

According to the thermoelectric generator 100, the heat exchanging fin 5 is configured to have a higher stiffness at the end fin portions 50 than at the intermediate fin portion 51. Therefore, it is possible to suppress the deformation of the holding members 3, 4 at a position corresponding to the intermediate fin portion 51. According to this, it is possible to secure the heat exchange performance by the heat exchanging fin 5, and it is possible to reduce the difference between the surface contact pressure between the center portion and the power generation module 1 and the surface contact pressure between the both end portions and the power generation module 1 using the heat exchanging fin 5. According to the thermoelectric generator 100, since the surface contact pressure between the thermoelectric conversion element and the holding members 3, 4 holding the thermoelectric conversion element can be uniform, the displacement of the holding members 3, 4 away from the holding member 3, 4 is suppressed, and accordingly the performance in heat transfer between the holding members 3, 4 and the power generation module 1.

The holding member includes the first holding member 3 and the second holding member 4 hold the power generation module 1 in a state where the end portions are joined with each other. The first holding member 3 and the second holding member 4 provide a holding force for sandwiching the stacked body in which the tube 6 and a pair of power generation modules 1 sandwiching the tube 6 are stacked with each other.

According to the thermoelectric generator 100, the heat is recovered from the second fluid flowing on both sides of the tube 6 through which the first fluid flows, and the power is generated by the power generation module 1. Accordingly, the thermoelectric generator 100 is capable of performing an effective power generation and heat recovery, and the thermoelectric conversion element is thermally protected and accordingly has a high durability.

The intermediate fin portion 51 is constituted by a straight fin having a corrugated shape in a cross-section perpendicular to the first direction and continuously extending in the first direction. The end fin portion 50 is constituted by an offset fin. The offset fin has multiple corrugated-shaped portions in which peak portions and valley portions are alternately arranged along the direction perpendicular to the first direction, and adjacent peak portions 50a and adjacent valley portions 50b adjacent in the first direction are offset from each other along a direction perpendicular to the first direction.

According to the thermoelectric generator 100, a part of the holding portions 3, 4 on which the offset fin is provided has a lower stiffness than a part on which the straight fin is provided. Consequently, the part on which the offset fin is provided easily bend compared to the center portion, and the performance in heat exchange can be improved. The part on which the straight fin is provided is unlikely to be bent, and accordingly a decrease in surface contact pressure can be suppressed. Accordingly, the surface contact pressure can be uniformed in the thermoelectric generator 100 as a whole, and the property in heat exchange of the thermoelectric generator 100 as a whole can be improved.

Second Embodiment

Figure 7:
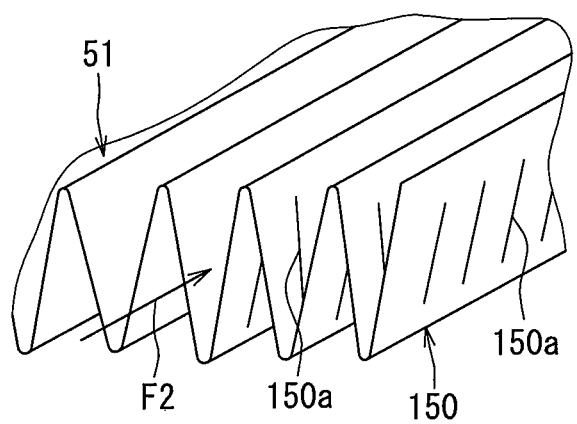
FIG. 7 is a diagram illustrating a heat exchanging fin according to a second embodiment of the present disclosure.

A heat exchanging fin according to a second embodiment will be described with reference to FIG. 7. In FIG. 7, parts assigned with the same reference numerals as the drawings of the first embodiment have the same configurations. The configurations, processes, actuations, and effects which are not particularly described in the second embodiment are the same as those in the first embodiment. Only differences from the first embodiment will be described below.

The heat exchanging fin of the second embodiment is different in configuration of an end fin portion 150 from the heat exchanging fin 5 of the first embodiment. The end fin portion 150 of the second embodiment has the same effect as the end fin portion 50 of the first embodiment. The end fin portion 150 is constituted by a straight fin having a corrugated shape in a cross-section perpendicular to a flow direction of the second fluid and continuously extending in the flow direction of the second fluid. A plate portion of the end fin portion 150 includes louvers 150a. The louvers 150a can be formed by a cut-and-raised portion, a slit-shaped opening, or the like formed in the plate portion.

According to such a heat exchanging fin, the second fluid, which is a high temperature fluid, forms a flow along the plate portion and a flow passing through the louver 150a in the end fin portion 150. Therefore, in the end fin portion 150, the generation of turbulent flow is promoted, and the heat exchange performance can be improved.

According to the heat exchanging fin of the second embodiment, since the end fin portion 150 and the intermediate fin portion 51 can be formed as an integral straight fin, those can be provided as single component without manufacturing separately. Accordingly, the number of manufacturing steps can be reduced. Further, since the end fin portion 150 can be produced by forming the louvers 150a in the fin portion having the same structure as the intermediate fin portion 51, the end fin portion 150 can be manufactured by pressing without multiple additional steps.

Third Embodiment

A heat exchanging fin according to a third embodiment will be described with reference to FIG. 8, 9. The configurations, processes, actuations, and effects which are not particularly described in the third embodiment are the same as those in the above-described embodiments. Only differences from the above-described embodiments will be described below.

Figure 8:
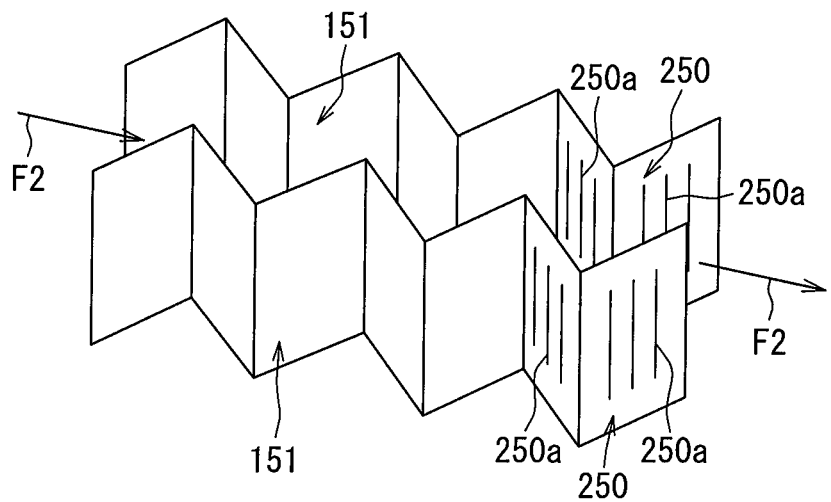
FIG. 8 is a diagram illustrating a heat exchanging fin according to a third embodiment of the present disclosure.
Figure 9:
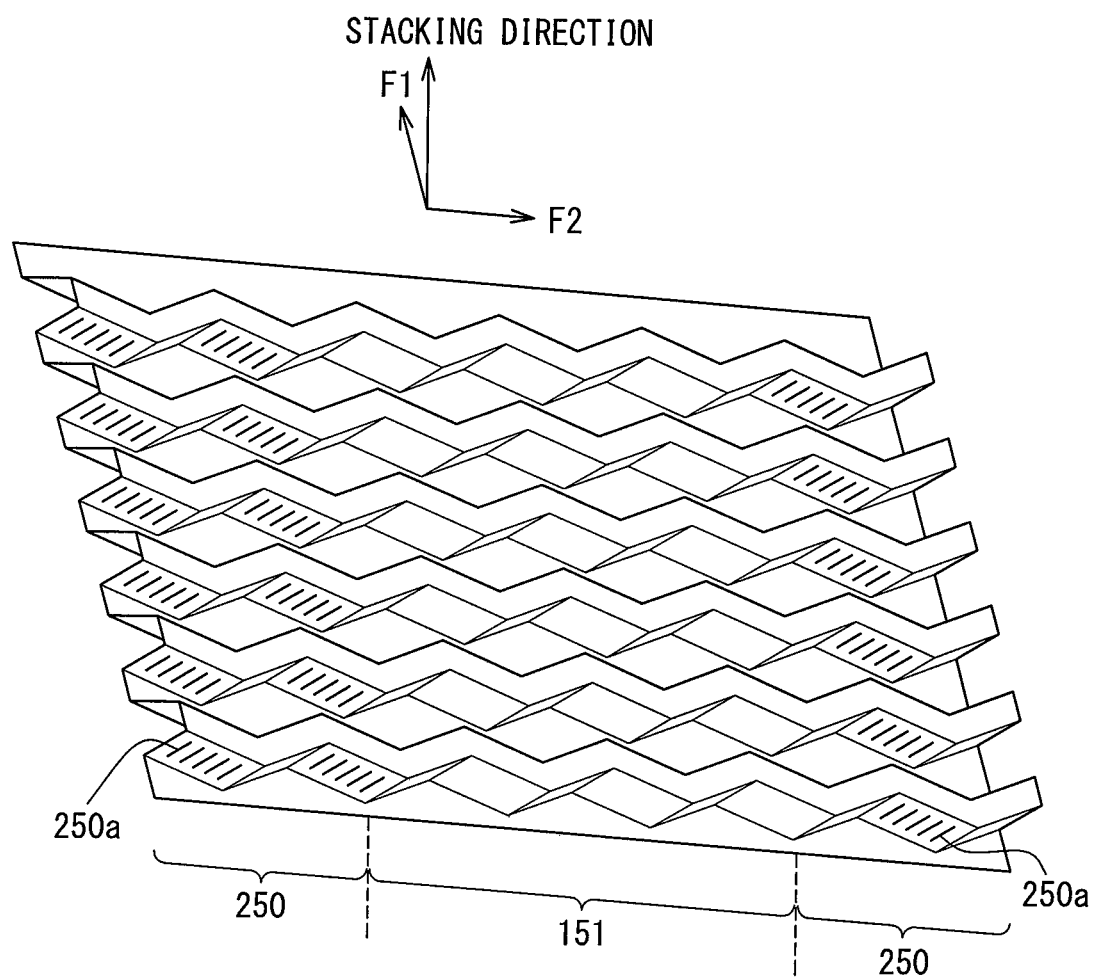
FIG. 9 is a diagram illustrating the heat exchanging fin according to the third embodiment.

As shown in FIG. 8, the heat exchanging fin according to the third embodiment is different from the heat exchanging fin of the second embodiment in that the heat exchanging fin of the third embodiment is constituted by multiple corrugated fin portions formed in a shape in which a corrugation advances along the flow direction of the second fluid. The corrugated fin portion may have a corrugated shape in the cross-section along the flow direction of the second fluid. The corrugated fin portions are aligned in a direction perpendicular to the flow direction of the second fluid with a space corresponding to a passage through which the second fluid flows. Each corrugated fin portion constitutes the intermediate fin portion 151 in the center portion and constitutes the end fin portion 250 on both sides of the intermediate fin portion 151. The end fin portion 250 is a fin portion having louvers 250a in the plate portion at both end portions. The louvers 250a can be formed by a cut-and-raised portion, a slit-shaped opening, or the like formed in the plate portion.

According to such heat exchanging fin, since the second fluid that is the high-temperature fluid flows tortuously between the corrugated fin portions, an area in which the second fluid contacts the fin portion increases, and the generation of the turbulence flow is promoted. Accordingly, the heat exchange performance can be improved.

According to the heat exchanging fin of the third embodiment, since one corrugated fin portion has the end fin portion 250 and the intermediate fin portion 151, the end fin portion 250 and the intermediate fin portion 151 can be a single component without manufacturing separately. Further, since the end fin portion 250 can be produced by forming the louvers 250a in the fin portion having the same structure as the intermediate fin portion 151, the end fin portion 250 can be manufactured by pressing without multiple additional steps.

The disclosure of this specification is not limited to the illustrated embodiment. The disclosure encompasses the illustrated embodiments and modifications by those skilled in the art based thereon. The present disclosure is not limited to combinations disclosed in the above-described embodiment but can be implemented in various modifications. The present disclosure can be implemented in various combinations. The disclosure may have additional parts that may be added to the embodiment. The disclosure encompasses omissions of parts and/or elements of the embodiments. The disclosure encompasses replacement or combination of parts and/or elements between one embodiment and another. The disclosed technical scope is not limited to the description of the embodiment.

The thermoelectric generator 100 described above can be widely applied to devices mounted on other than automobiles. For example, the thermoelectric generator 100 may be combined with an exhaust heat recovery device in which a gas generated in a boiler used for an industrial purpose or a house use is used as the high-temperature fluid. The thermoelectric generator 100 may be applied to a power generator using an exhaust heat from a factory or incinerator as the high-temperature fluid, a power supply of an electric device, or a portable generator.

The thermoelectric generator 100 is not limited to the configuration shown in the drawings. For example, the thermoelectric generator 100 may be configured to integrally hold a stacked body formed by the tube 6 and the power generation modules 1 on only one side of the pipe 6 by a holding member. That is, the thermoelectric generator 100 may hold the stacked body only on one side of the tube 6.

In the above-described embodiments, the thermoelectric generator 100 including one power generation unit is disclosed, but the thermoelectric generator 100 may include multiple power generation unit stacked with each other. In this case also, the high-temperature fluid flows in contact with the heat exchanging fins 5 located between the power generation units stacked with each other.

The plate portion of the intermediate fin portion 51 of the first embodiment is not limited to the form continuously extending along the direction F2. The plate portion of the intermediate fin portion 51 may extend continuously along the direction intersecting the direction F2.

In the above-described embodiments, the second holding member 4 is smaller than the first holding member 3, and the first holding member 3 is joined with the second holding member 4 to cover. However, the first holding member 3 and the second holding member 4 may have the same size and be joined in a staggered combination.

In the above-described embodiment, the first holding member 3 and the second holding member 4 are welded to each other to seal the inner space surrounded by the first holding member 3 and the second holding member 4 from the outside. However, the first holding member 3 and the second holding member 4 may not be completely sealed, and may be joined to such an extent that the high temperature fluid does not adversely affect the power generation module 1 in the inner space. For example, the first holding member 3 and the second holding member 4 may be joined by spot welding at multiple points.

The power generation module 1 of the above-described embodiments is not covered with a casing, and a large number of P-type semiconductor elements and N-type semiconductor elements are exposed in an internal space surrounded by the first holding member 3 and the second holding member 4. In the thermoelectric generator 100, the casing is not an essential component. In this case, it is preferable to seal the inner space with a cover or the like.

In the above-described embodiments, the interface between the joining portion 3a of the first holding member 3 and the joining portion 4a of the second holding member 4 is flat. However, the interface may have saw-like protrusions engaged with each other or an unevenness having a labyrinth shape.

In the above embodiments, the portion where the first holding member 3 and the second holding member 4 are in contact with the power generation module 1 is a flat surface, but may be curved. A thermal connecting member such as grease excellent in heat conduction may be provided between the first holding member 3, the second holding member 4 and the power generation module 1. The thermal connecting member is preferably a member which is easily deformed by an external force than the tube 6, the first holding member 3 and the second holding member 4 and has a low hardness. According to this configuration, since the thermal connecting member can be deformed according to the expansion and shrinkage of each member, the power generation module 1 is easily displaced with respect to the tube 6, the first holding member 3, and the second holding member 4. Therefore, since the power generation module 1 can be easily displaced even if each member expands or contracts due to the temperature difference between the high-temperature fluid and the low-temperature fluid, it is possible to improve effect for reducing the stress due to the distortion of each member or absorb thermal expansion difference.

In the above-described embodiments, the flat tube 6 forming the second passage defines multiple passages therein, but it is not limited to such a form. In addition, the tube 6 may have an outer shape other than flat shape, or may have a form with fins inside.

In the embodiments described above, the low-temperature fluid and the high-temperature fluid may form countercurrents flowing in opposite directions.

Although the present disclosure has been described in accordance with the embodiments, it is understood that the present disclosure is not limited to the embodiments and structures disclosed therein. To the contrary, the present disclosure is intended to cover various modification and equivalent arrangements. In addition, while the various elements are shown in various combinations and configurations, which are exemplary, other combinations and configurations, including more, less or only a single element, are also within the spirit and scope of the present disclosure.

What is claimed is:

1. A thermoelectric generator comprising:
a tube in which a first fluid flows;
a power generation module including a thermoelectric conversion element and stacked with the tube;
a holding member whose both end portions are located and fixed outside both ends of a stacked body in which the power generation module and the tube are stacked with each other, the holding member providing a holding force to hold the power generation module and the tube such that heat can be transferred between the power generation module and the tube; and
a heat exchanging fin provided on a reverse surface of the holding member behind which a surface of the holding member contacts the power generation module, the heat exchanging fin being configured to contact with a second fluid higher in temperature than the first fluid, wherein
the heat exchanging fin includes
a pair of end fin portions provided on the reverse surface of the holding member at portions corresponding to the both ends of the stacked body, and
an intermediate fin located between the pair of end fin portions and higher in stiffness than the pair of end fin portions,
the tube has a pair of flat surfaces in a cross section perpendicular to a flow direction of the first fluid,
the power generation module is disposed on one flat surface of the pair of flat surfaces of the tube,
the holding member further includes a pair of the holding members sandwiching the stacked body in a direction in which the tube and the power generation module are stacked with each other,
an end of one holding member of the pair of the holding members extends toward a surface of another holding member of the pair of the holding members facing the one holding member,
an end of the other holding member extends toward a surface of the one holding member facing the other holding member,
the ends of the pair of the holding members are joined with each other to hold the stacked body, and
the pair of end fin portions are end portions of the heat exchanging fin in a direction perpendicular to the direction in which the tube and the power generation module are stacked with each other.

2. The thermoelectric generator according to claim 1, wherein
the intermediate fin portion includes a straight fin that has a plate portion continuously extending in a first direction, a cross-section of the straight fin perpendicular to the first direction having a corrugated shape,
the end fin portion includes an offset fin that includes corrugated portions in each of which peaks and valleys are alternately arranged in a direction perpendicular to the first direction, and
the peaks and the valleys of one of the corrugated portions are offset in the direction perpendicular to the first direction from the peaks and the valleys of adjacent one of the corrugated portions adjacent to the one of the corrugated portions in the first direction.

3. The thermoelectric generator according to claim 1, wherein
the intermediate fin portion includes a straight fin portion that has a plate portion continuously extending in a flow direction of the second fluid, a cross-section of the straight fin portion perpendicular to the flow direction of the second fluid having a corrugated shape, and
the end fin portion includes a straight fin portion that has a plate portion having a louver and continuously extending in the flow direction of the second fluid, a cross-section of the straight fin portion perpendicular to the flow direction of the second fluid having a corrugated shape.

4. The thermoelectric generator according to claim 1, wherein
the intermediate fin portion includes corrugated fin portions, a cross-section of each of the corrugated fin portions in a flow direction of the second fluid having a corrugated shape, and
the end fin portion includes corrugated fin portions having a louver, a cross-section of each of the corrugated fin portions in the flow direction of the second fluid having a corrugated shape.

5. The thermoelectric generator according to claim 1, wherein
the holding member is in contact with the power generation module through a graphite sheet provided between the holding member and the power generation module.

6. The thermoelectric generator according to claim 1, wherein
the tube has a surface contacting the power generation module,
a cross-section of the tube has a flat shape, and
the both end portions of the holding member are located outside the both ends of the stacked body in a longitudinal direction of the flat shape of the tube.

7. A thermoelectric generator comprising:
a tube in which a first fluid flows;
a power generation module including a thermoelectric conversion element and stacked with the tube;
a holding member whose both end portions are located and fixed outside both ends of a stacked body in which the power generation module and the tube are stacked with each other, the holding member providing a holding force to hold the power generation module and the tube such that heat can be transferred between the power generation module and the tube; and
a heat exchanging fin provided on a reverse surface of the holding member behind which a surface of the holding member contacts the power generation module, the heat exchanging fin being configured to contact with a second fluid higher in temperature than the first fluid, wherein
the both ends of the stacked body are end portions in a direction intersecting a flow direction of the first fluid, the heat exchanging fin includes
  a pair of end fin portions provided on the reverse surface of the holding member at portions corresponding to the both ends of the stacked body, and
  an intermediate fin located between the pair of end fin portions and higher in stiffness than the pair of end fin portions,
the tube has a pair of flat surfaces in a cross section perpendicular to a flow direction of the first fluid,
the power generation module is disposed on one flat surface of the pair of flat surfaces of the tube,
the holding member further includes a pair of the holding members sandwiching the stacked body in a direction in which the tube and the power generation module are stacked with each other,
an end of one holding member of the pair of the holding members extends toward a surface of another holding member of the pair of the holding members facing the one holding member,
an end of the other holding member extends toward a surface of the one holding member facing the other holding member,
the ends of the pair of the holding members are joined with each other to hold the stacked body, and
the pair of end fin portions are end portions of the heat exchanging fin in a direction perpendicular to the direction in which the tube and the power generation module are stacked with each other.

* * * * *